United States Patent [19]

Person

[11] Patent Number: 5,091,286

[45] Date of Patent: Feb. 25, 1992

[54] LASER-FORMED ELECTRICAL COMPONENT AND METHOD FOR MAKING SAME

[75] Inventor: Herman R. Person, Columbus, Nebr.

[73] Assignee: Dale Electronics, Inc., Columbus, Nebr.

[21] Appl. No.: 587,761

[22] Filed: Sep. 24, 1990

[51] Int. Cl.$^5$ .............................................. G03F 7/207
[52] U.S. Cl. ..................................... 430/297; 430/311; 430/323; 430/945; 156/643
[58] Field of Search ............... 430/311, 313, 318, 319, 430/297, 945, 322, 323; 156/643, 659.1

[56] References Cited

U.S. PATENT DOCUMENTS

| | | | |
|---|---|---|---|
| 2,832,935 | 4/1958 | Tank | 333/29 |
| 3,089,106 | 5/1963 | Saaty | 336/200 |
| 3,125,746 | 3/1964 | Broadbent | 340/174 |
| 3,210,707 | 10/1965 | Constantakes | 336/200 |
| 3,247,573 | 4/1966 | Noack | 29/155.5 |
| 3,413,716 | 12/1968 | Schwertz et al. | 29/602.1 |
| 3,490,055 | 1/1970 | Cox | 333/70 |
| 3,798,059 | 3/1974 | Astle et al. | 117/212 |
| 4,183,074 | 1/1980 | Wallace | 361/402 |
| 4,313,151 | 1/1982 | Vranken | 361/402 |
| 4,313,152 | 1/1982 | Vranken | 361/402 |
| 4,322,698 | 3/1982 | Takahashi et al. | 333/184 |
| 4,342,143 | 8/1982 | Jennings | 29/25.42 |
| 4,877,480 | 10/1989 | Das | 430/945 |

OTHER PUBLICATIONS

Lambda Physik, Inc., "Lambda Mark, An Excimer Laser Non-contact Marker", Aug. 1988.
Palomar Systems & Machines, Inc., "Model 5000 Laser Marker System Product Manual", Mar. 20, 1990.

Primary Examiner—Marion E. McCamish
Assistant Examiner—Kathleen Duda
Attorney, Agent, or Firm—Zarley, McKee, Thomte, Voorhees, & Sease

[57] ABSTRACT

An electrical component includes a plurality of laminated layers of ferrite material, each layer having a conductive coil printed thereon. The conductive coil is formed by first printing a conductive sheet material on top of the ferrite layer, and then by exposing the conductive sheet material to a burst of laser energy focused in a predetermined pattern which cuts the coil out of the conductive sheet member.

4 Claims, 2 Drawing Sheets

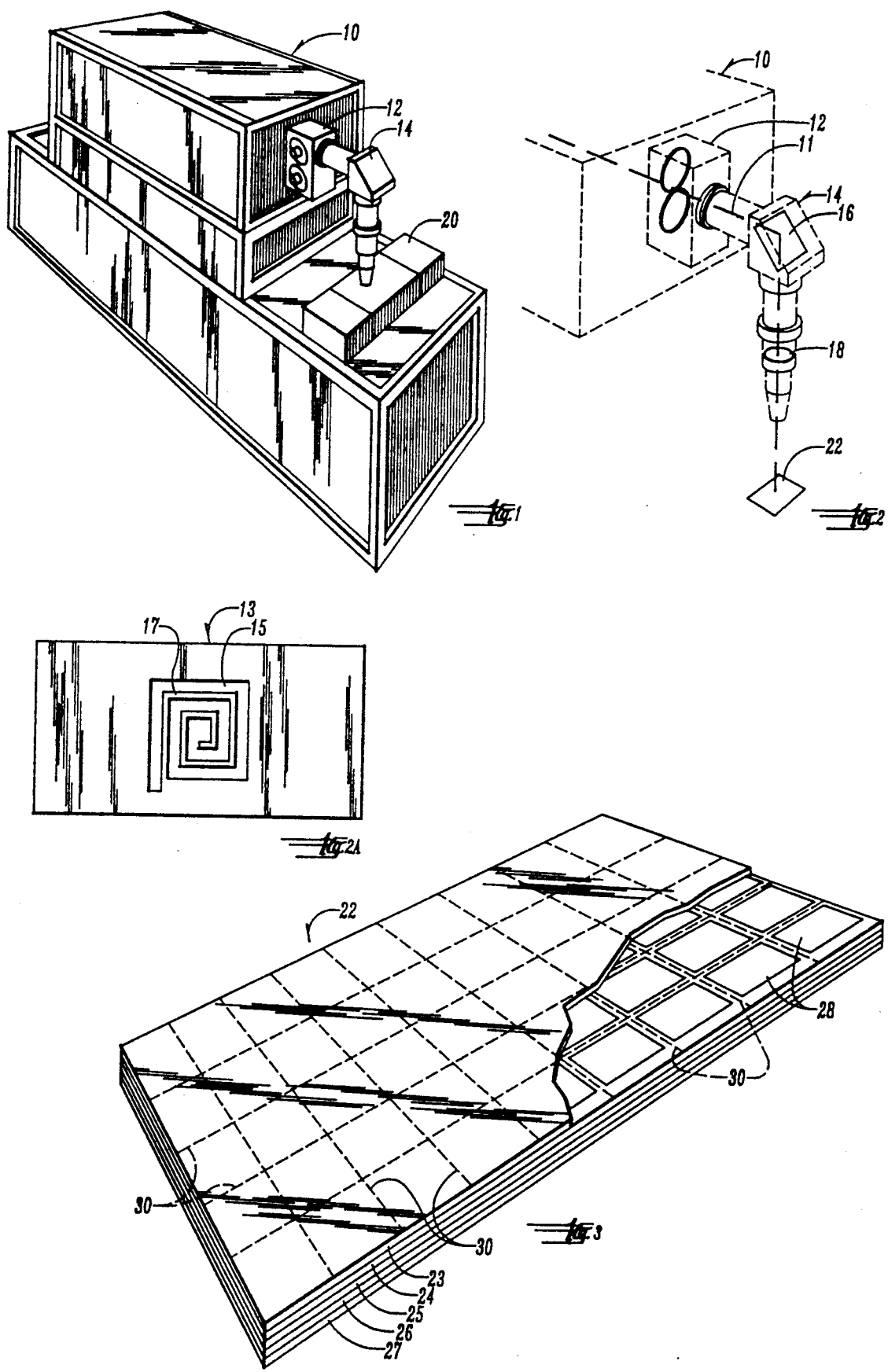

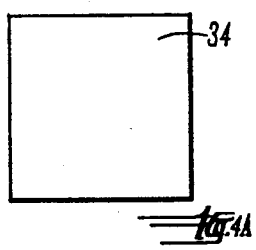
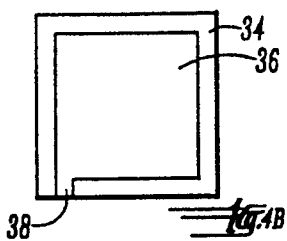
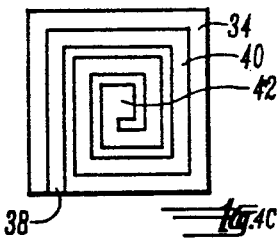
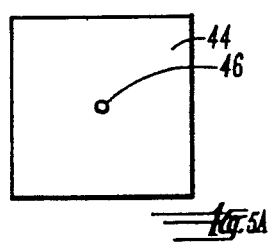
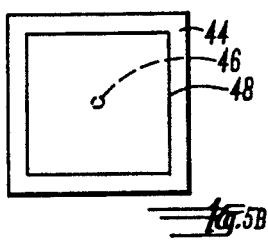
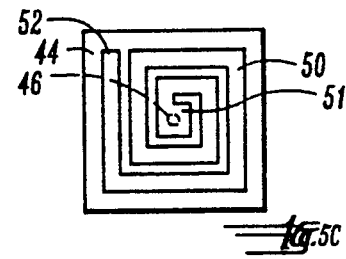
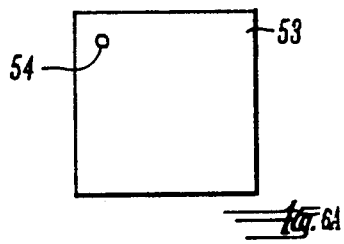
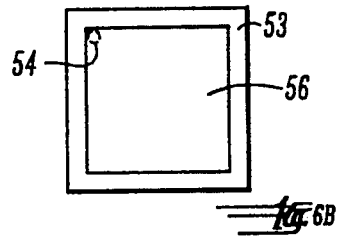
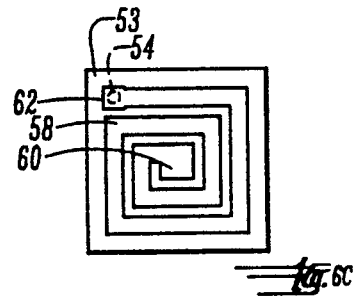
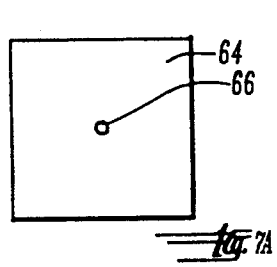
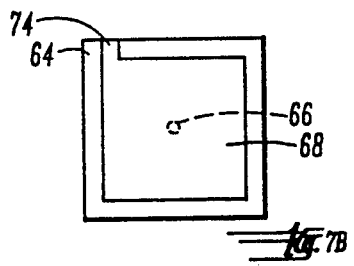
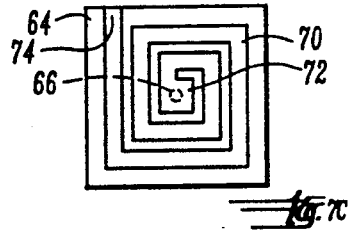
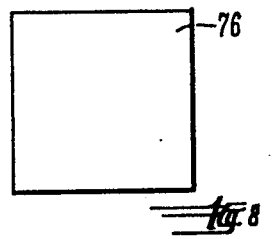
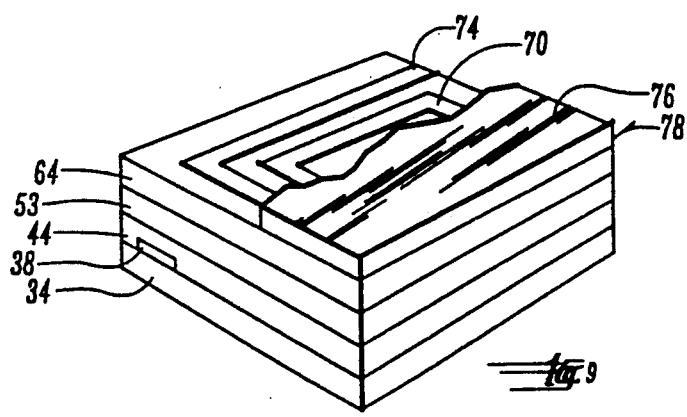

5,091,286

LASER-FORMED ELECTRICAL COMPONENT AND METHOD FOR MAKING SAME

BACKGROUND OF THE INVENTION

The present invention relates to a laser-formed electrical component and method for making same. Specifically, the present invention relates to a laminated electrical component comprising laminated layers of insulating material alternated with printed patterns of helical coils formed from electrical conductive material.

Many electrical components utilizing coils have been manufactured in chip form, with various alternating layers of ferrite material and conductors. However, there are several disadvantages resulting from the present methods for manufacturing these devices. Most coils formed in this manner do not include a complete coil having more than one revolution at each laminated layer. Instead, present devices place a portion of each coil on different layers and connect these portions to provide a completed coil having several turns.

Some present devices do place an entire coil having more than one turn on each ferrite layer; however, such devices are limited in their ability to be miniaturized due to the limitations of the printing techniques used. Present methods for forming the conductive coils on each layer usually involve the printing of the conductive material on the ferrite layer. Most techniques for printing these layers do not permit the lines to be much smaller than 8–10 mills., and do not permit the spaces between the lines to be much smaller than 8–10 mills. This minimum dimension of the lines and spaces places a limit on the amount of miniaturization which can be achieved with coils of this type.

Lasers have been utilized in the resistor art for trimming resistors, and for forming resistors. However, the laser methods presently being used involve the tracing with a laser beam along the particular pattern of conductor desired. This is a time consuming task and does not permit the conductor to be formed in a quick instantaneous fashion.

Therefore, a primary object of the present invention is the provision of an improved laser-formed electrical component and method for making same.

A further object of the present invention is the provision of an improved laser-formed electrical component which can be manufactured to smaller sizes than prior art devices, while at the same time achieving the same or greater inductance value than presently available.

A further object of the present invention is the provision of a method and means for making electrical components, wherein many patterns can be formed instantaneously by a single burst of laser light.

A further object of the present invention is the provision of a method and means for making electrical components which permits the width of the inductance coil lines and the width of the spaces between the inductor coil lines to be made smaller than in prior devices.

A further object of the present invention is the provision of a method and means which permits several electrical conductor coils to be formed at once by a single burst of laser energy.

A further object of the present invention is the provision of a device and method which is economical to use, efficient in operation, and reliable.

SUMMARY OF THE INVENTION

The present invention utilizes an Excimer laser system which is capable of directing a burst of laser energy through a mask assembly. The mask may be a metal plate into which the desired pattern has been cut. Acting like a stencil, the mask causes the image of the desired pattern to be focused through a lens onto a substrate having a layer of conductive material thereon. The image burns away a portion of the conductor layer, leaving the desired pattern such as a coil or other electrical conductor path.

Inductor coils can be manufactured to include alternating layers of ferrite material and conductor coils. The conductor coils are formed by printing a layer of conductive material such as silver on the upper surface of a ferrite layer. The laser is then used to project a negative image on the conductor layer so as to remove the conductive material exposed to the negative image. This leaves the conductive coil formed on the upper surface of the ferrite layer.

Additional pairs of layers may be formed in the same fashion and stacked upon one another to create a stacked chip having a complete conductive coil having more than one complete turn at each layer. Holes are provided in the ferrite layers for connecting the various conductive coils within the laminated chip in series with one another to achieve the desired inductance.

Excimer laser systems are presently available which are capable of projecting an image over an area from 5 to 10 square millimeters. This permits several chips to be formulated at once. Thus, it is possible to manufacture a single layer for a group of chips with one single burst of the laser energy. The individual layers are manufactured separately, and then are stacked upon one another and fired so as to form them into a single laminated group of layers. Diamond saws are then used to cut the stacked layers into individual chips.

BRIEF DESCRIPTION OF THE DRAWINGS

FIG. 1 is a perspective view of the laser system utilized with the present invention.

FIG. 2 is a schematic view showing the manner in which the laser system directs the laser beam onto the work piece.

FIG. 2a is a plan view of a mask utilized in the present invention.

FIG. 3 is a view showing the stacked multiple chip layers which are formed by the present invention.

FIGS. 4a–4c are top plan views of a single chip showing the first step in forming a first layer of ferrite material and an electrical conductor coil.

FIGS. 5a–5c; 6a–6c; and 7a–7c are views similar to FIGS. 4a–4c, and show the steps for forming additional layer pairs for the laminated chip.

FIG. 8 shows the final layer which is placed on the laminated chip.

FIG. 9 is a perspective view of a single laminated chip, showing portions of the upper layer cut away.

DESCRIPTION OF THE PREFERRED EMBODIMENT

FIG. 1 illustrates an Excimer laser system 10 which may be utilized for the present invention. These systems are currently available for use in marking and labeling electrical components. However, these systems have not been utilized for the process contemplated by the present invention. An example of such a system is manufactured by Lambda Physik, Inc., 289 Great Road, Acton, Mass. 01720 under the trademark "Lambda Mark".

The system generates a burst of laser light designated by the line 11 in FIG. 2. The laser light 11 is directed first through a mask assembly 12 which includes a mask or stencil having the desired pattern formed therein. After passing through the mask, the laser is shaped into the image desired and is deflected by mirror assembly 14 having mirror 16 therein downwardly through an imaging lens 18. Lens 18 can reduce the image several times so as to intensify the image and provide greater focus to the image. The image then is directed toward a work surface 20 on which a work piece is placed. With respect to the present invention, a mask 13 is utilized which contains a coil negative pattern 15 therein. Pattern 15 is an opening through the mask 13 which is in the negative shape of the coil desired to be formed. Thus, the resulting coil will ultimately result in the form of the solid portion 17 shown in FIG. 2a.

Referring to FIG. 3, a stack 22 of sheet members 23, 24, 25, 26, 27 is shown. The top sheet member 23 is made of a ferrite material commonly used in the making of monolithic inductor chips. The remaining sheet members 24-27 are also ferrite sheet members, but include various printed conductive coils 28 thereon. The coils 28 on each sheet member are identical to one another, but the coils are different from one sheet member to another as will be explained more fully hereinafter.

The dotted lines 30 represent cut lines which are ultimately cut with a diamond saw to cut each of the stacked members into individual chips containing one set of coils 28. FIG. 3 is drawn out of scale to illustrate the various components of the invention. However, in true scale, the layers 23-27 are paper thin, and the lines of the coils 28 are approximately 5 mills wide with the spaces between the lines within the coils also being approximately 5 mills.

The construction of each individual chip is illustrated in FIGS. 4-8, but in actual practice the layers for a plurality of chips are printed on each of the ferrite layers 23-27 as shown in FIG. 3. A first ferrite layer 34 provides the bottom layer of the chip, FIG. 4a. This ferrite layer 34 represents one of the chips located in the multi-chip layer 27 shown in FIG. 3.

FIG. 4b shows a first solid conductor layer 36 printed on the upper surface of ferrite layer 34. Conductor 36 is preferrably a silver material commonly used in printed components of this type. Layer 36 includes a connector pad 38 which extends to the outer margin of ferrite layer 34.

In FIG. 4c, the completed conductive coil 40 is shown. Conductive coil 40 is formed by exposing the conductive layer 36 to a burst of laser light which has first passed through mask 13 and then has been reflected downwardly by mirror 16 through lens 18. Thus, the negative image pattern 15 is focused on the conductive layer 36 and burns away portions of the layer 36 so as to leave the conductive coil 40 as shown in FIG. 4c. Coil 40 includes a center pad 42.

It should be noted that conductive coil 40 includes at least two complete turns of the coil on one surface. Furthermore, the width of the conductor 40 can be as small as 5 mills. with the spaces between the conductor coils being approximately 5 mills. This is substantially smaller than is normally achieved with prior devices, and it permits a maximum amount of inductance to be achieved within a minimum of space.

FIGS. 5a, b, and c illustrate the second laminated layer which is formed by utilizing ferrite sheet 44. The individual chip includes a second ferrite layer 44 having an aperture 46 in the center thereof which is in alignment above the center pad 42 of the first conductive coil 40. A second conductive layer 48 is printed over the ferrite layer 44, and the desired image is passed through a mask similar to that shown in FIG. 2a. However, the particular format for the mask is shaped so as to produce the second conductive coil pattern 50 shown in FIG. 5c. Coil pattern 50 includes a second center pad 51 which is in vertical alignment with aperture 46 and includes a second end pad 52. The conductive material at the center pad 51 protrudes downwardly through the aperture 46 so as to make electrical contact with center pad 42 of coil 40. This electrically connects coils 40 and 50 in series with one another.

FIGS. 6a-6c show a third laminated layer comprising a third ferrite layer 53 having a connector hole 54 therein; a third conductive layer 56, and a third conductive coil 58 which is formed by a focused laser image similar to the manner in which coils 40 and 50 are formed. The aperture 54 permits the third end pad 62 of coil 58 to be connected to the end pad 52 of coil 50, thereby placing coils 40, 50, and 58 in series with one another. Coil 58 includes a center pad 60.

FIGS. 7a-7c show a fourth laminated layer having a fourth ferrite layer 64 with an aperture 66 therein; a printed conductive layer 68 having an end pad 74 thereon; and a fourth conductive coil 70 having a center pad 72 thereon. Coil 70 is formed by a focused laser image in similar fashion to the method used for forming coils 40, 50, and 58. The center pad 72 protrudes through aperture 66 so as to form electrical contact with center pad 60 of third conductive coil 58. This places all four of the coils 40, 50, 58, and 70 in series with one another.

A final ferrite layer 76, FIG. 8, is placed over the laminated pad, so as to provide the configuration shown in FIG. 9.

The chip 78 shown in FIG. 9 comprises one of the plurality of chips which are formed by cutting along the dotted lines 30 of the stack of sheet members 23-27 in FIG. 3. The ferrite layers 34, 44, 53, 64, and 76 are formed from the sheet members 27, 26, 25, 24, and 23 respectively of FIG. 3. The sheet members 23-27 are formed individually and then are placed together in stacked fashion such as shown in FIG. 3. Specifically, the method of the present invention contemplates printing each layer 23-27 individually by printing the conductive layers 36, 48, 56, and 68 thereon. The printed conductors are then permitted to dry. Next, the printed conductors are exposed to the images from the laser system 10. Each sheet member 23-27 is individually exposed, but each sheet member includes a plurality of identical sub-parts. After the sheet members 23-27 have been exposed to the image to form the coils 40, 50, 58, and 70, the sheet members 23-27 are stacked in the manner shown in FIG. 3 and are pressed together. While being pressed, they are fired so as to cause them to join together into a single unit.

After firing, the laminated sheet members 23-27 are then cut by a diamond saw along the lines 30 so as to form individual stacked chips such as chip 78.

The present invention permits the chips to be miniaturized more than in prior art devices. Because the chips are miniaturized, more than one complete turn of the coil can be placed on each layer; whereas, with prior art devices, it was necessary to place less than a complete turn on each layer. The coils of the present invention can be miniaturized to the point where the conductors have a width of approximately 5 mills with the spacing within the coil also being approximately 5 mills wide. As many stacks as needed can be provided in the chip, or the chip can be comprised of only one coil and one layer.

The present method permits the forming of the coils for large numbers of chips simultaneously with a single burst of laser energy. Because the laser image is reduced down, the laser cut can be many times smaller than that made by screen printing, and the corresponding inductance values can be much larger than presently available. Thus, it can be seen that the device accomplishes at least all of its stated objectives.

I claim:

1. A method for making an electrical component comprising:

placing a film of electrically conductive material on the upper surface of a substrate of insulative material;

passing a beam of laser light through a mask having a stencil opening therein shaped in the form of a negative pattern, whereby said laser beam after passing through stencil opening of said mask has a shape conforming to said negative pattern;

using a lens positioned in the path of said laser beam between said mask and said film of electrically conductive material to focus said laser beam in a negative image on said film of electrically conductive material, whereby said laser beam will burn away a portion of said conductive material in the shape of said negative image, thereby leaving a desired pattern of said electrically conductive material on said substrate.

2. A method to claim 1 and further comprising printing a layer of ferrite material over said first mentioned layer of conductive material, printing a second layer of conductive material over said layer of ferrite material, passing a beam of laser light through a second mask having a second stencil opening therein shaped in the form of a second negative pattern, passing said laser beam through said lens and focusing said laser beam in a second negative image on said second film of conductive material, whereby said laser beam will burn away a portion of said conductive material in the shape of said second negative image, thereby leaving a second desired pattern of said second conductive material on said layer of ferrite material.

3. A method according to claim 2 comprising forming said first and second desired patterns in spiral form and interconnecting said first desired pattern electrically to said second desired pattern.

4. A method according to claim 1 comprising using a negative pattern image of laser light which produces said desired pattern in the form of a spiral on said substrate.

* * * * *